United States Patent

Zibrik et al.

[11] Patent Number: 5,517,069
[45] Date of Patent: May 14, 1996

[54] BATTERY CONTACTS HAVING A HIGH FREQUENCY ENERGY FILTERING CHARACTERISTICS

[75] Inventors: Larry J. Zibrik, Richmond; Mark A. Harold, Vancouver, both of Canada

[73] Assignee: Motorola, Inc., Schaumburg, Ill.

[21] Appl. No.: 222,045

[22] Filed: Apr. 4, 1994

[51] Int. Cl.[6] ............................. H01M 2/28; H05K 9/00
[52] U.S. Cl. .......................... 307/91; 174/35 R; 361/818; 429/121
[58] Field of Search .................... 307/89, 91, 109, 307/150; 361/816, 818; 174/35 R, 35 GC; 343/841, 851; 439/500; 429/121; 333/12, 222, 243, 244; 455/300

[56] References Cited

U.S. PATENT DOCUMENTS

| | | | |
|---|---|---|---|
| 4,122,416 | 10/1978 | Oblak et al. | 333/12 |
| 4,641,224 | 2/1987 | Reimer | 333/12 |
| 4,661,889 | 4/1987 | Fushimoto | 361/818 |
| 5,034,720 | 7/1991 | Bell et al. | 429/121 |

Primary Examiner—William M. Shoop, Jr.
Assistant Examiner—Richard T. Elms
Attorney, Agent, or Firm—Charlie W. Bethards

[57] ABSTRACT

A battery contact and shielded enclosure having a high frequency energy filtering characteristic includes a battery contact having a movable portion and a fixed portion, the fixed portion mechanically coupled to a dielectric portion of a carrier having a conductive portion, and a chip capacitor electrically coupled between the fixed portion and the conductive portion the chip capacitor providing a low impedance path from the fixed portion to the conductive portion for high frequency energy on the battery contact.

2 Claims, 1 Drawing Sheet

BATTERY CONTACTS HAVING A HIGH FREQUENCY ENERGY FILTERING CHARACTERISTICS

FIELD OF THE INVENTION

This disclosure deals with battery contacts advantageously arranged to provide a high frequency energy filtering characteristic and more particularly but not limited to such contacts deployed as part of a shielded housing,

BACKGROUND OF THE INVENTION

Battery contacts are well known and operate to provide a connection between a battery and another circuit or apparatus that requires power from or possibly supplies power to the battery in the case of, for example, a battery charger. Typically due to a relatively short useful life for batteries, such contacts must consider battery replacement, removal, or substitution. The contacts must be arranged to facilitate the replacement, etc. of the battery in a reasonably burden free and reliable manner for the majority of users. Such contacts are known and are available in various configurations.

Battery contacts by there nature are usually or often connected to circuits or other apparatus that inherently generate time varying energy, either voltage or current, wave forms. Often these circuits demand a time varying amount of power from the battery. This power or time varying energy is conducted through the contact and associated structures. These time varying energy wave forms can also be propagated by electromagnetic fields through space from the source circuits to the contacts and associated structures. In either event the battery contacts may facilitate or induce radiate time varying energy when conducting a time varying amount of power or re-radiate such energy when they have been exposed.

Unfortunately this time varying energy while likely desirable at the source of the energy and intended points of reception or where the energy is to be used can have devastating effects, specifically electromagnetic interference, on unintended recipients of the energy. Various approaches, with various attendant problems, are known for providing an electromagnetic shield, for example a conductive enclosure, surrounding the sources or alternatively the unintended recipients of this energy. Among others, one problem with electromagnetic shields arises when any physical openings or ports, such as for battery contacts, are required in the electromagnetic shield.

Historically practitioners have typically taken advantage of relatively large physical spacing, thus inherent path loss, between sources and unintended recipients to avoid, rather than eliminate, potential problems. Concerns about this issue have prompted regulations by the Federal Communications Commission (FCC) establishing the maximum amount of such radiated energy various devices are allowed to exhibit or radiate. Generally minor openings and un-filtered battery contacts, although allowing some radiated energy have been sufficient to comply with FCC regulations. However and assuming compliance, these regulations have proven insufficient for some applications.

Practitioners driven by a demand for small user friendly wireless data communications devices are beginning to combine computing devices and wireless transceivers in small portable packages. In this application extreme measures may be required to assure that energy generated by a wireless transceiver does not interfere with a computing device and equally important that energy generated by the computing device does not interfere with the wireless transceiver. For the reasons noted above one potential source of such energy is the battery contacts or power contacts of either the computer or transceiver.

Filtered battery contacts employing coaxial capacitors disposed about the power conductor are commercially available and may provide satisfactory performance in some applications. However such contacts have not proven to be economically viable in some applications and may be too physically fragile for a portable environment. Clearly a need exists for a cost effective filtered battery contact suitable for portable environments.

BRIEF DESCRIPTION OF THE DRAWINGS

The features of the present invention which are believed to be novel are set forth with particularity in the appended claims. However, the invention together with further advantages thereof, may best be understood by reference to the accompanying drawings in which:

DETAILED DESCRIPTION OF A PREFERRED EMBODIMENT

Generally the instant invention deals with a battery contact assembly that provides a high frequency energy filtering characteristic. This battery contact may be advantageously used in conjunction with an appropriate enclosure to provide improved shielding for electronic circuits that may be particularly susceptible to interference from radiated energy or alternatively prone to radiate such interfering energy. Preferably, the battery contact includes a spring loaded battery contact having a fixed portion electrically coupled to a movable portion. The fixed portion of the spring loaded battery contact is mechanically coupled to a dielectric portion of a carrier, preferably a printed circuit board substrate, that further includes a conductive portion, preferably a circuit board conductor. Additionally a chip capacitor is electrically coupled from the fixed portion to the conductive portion and mechanically coupled to the carrier. The chip capacitor thus provides a low impedance path from the fixed portion to the conductive portion for high frequency energy on the movable portion of the spring loaded battery contact.

Figure 1:
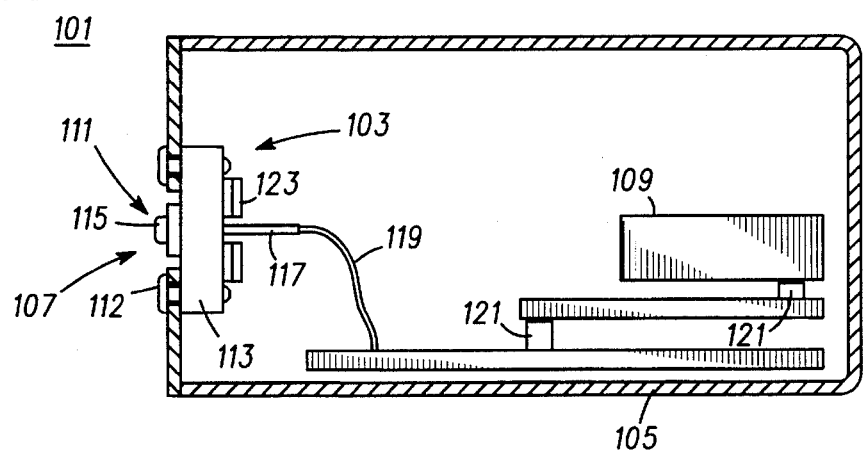
FIG. 1 is a cross sectional view of an exemplary assembly utilizing a preferred embodiment of the instant invention.

The present invention may be more fully described and appreciated by referring to the figures. FIG. 1 is a cross sectional view of an exemplary assembly depicting a preferred embodiment of the instant invention. FIG. 1 shows in cross section a shielded enclosure (101) having a battery contact, or more descriptively a contact assembly (103), with a high frequency energy filtering characteristic for supplying power to the enclosure. The shielded enclosure (101) includes an electrically conductive housing (105) with a port (107) through which power, among other signals, is provided to an interior of the shielded enclosure (101). The electrically conductive housing (105) is arranged and constructed to surround and enclose an interior electronic assembly, such as a transceiver (109). The electrically conductive housing (105) is preferably fashioned from tin, phosphor bronze, or other appropriate highly conductive materials.

The contact assembly (103) generally includes a carrier (113), that is mechanically coupled by, for example, screws (112) to the electrically conductive housing (105) such that the port (107) is physically covered by the carrier. The carrier, described below with reference to FIG. 2, has a dielectric portion and a conductive portion and the conductive portion is electrically coupled to the housing. A battery contact (111) is mechanically coupled to the carrier (113) such that a first part (115) is disposed external to the enclosure and a second part (117) is disposed within the interior. This arrangement allows the battery contact (111) to be electrically coupled to a battery or other power source (not shown) and thus supply power to the interior of the shielded enclosure. Within the enclosure this power may be distributed by a flexible conductor (119), such as a wire or flexible cable, and a connector or connector system (121).

The contact assembly further includes a bypass capacitor, such as a chip capacitor (123) within the interior. The chip capacitor(s) (123) are mechanically coupled to the carrier and have contacts, one each electrically coupled respectively to the battery contact and to the conductive portion of the carrier (113). The chip capacitor(s) (123), so arranged, provide a low impedance path from the battery contact to the housing for high frequency energy on the battery contact (111). In practice the chip capacitor may be a plurality of variously valued chip capacitors where the each value is optimized for a particular frequency of radiated energy. Experimental results using a 100 nano-farad and 1000 nano-farad capacitor have provided as much as 21 dB improvement over an identical housing arrangement with no capacitors for energy at a frequency of 860 MHz.

Figure 2:
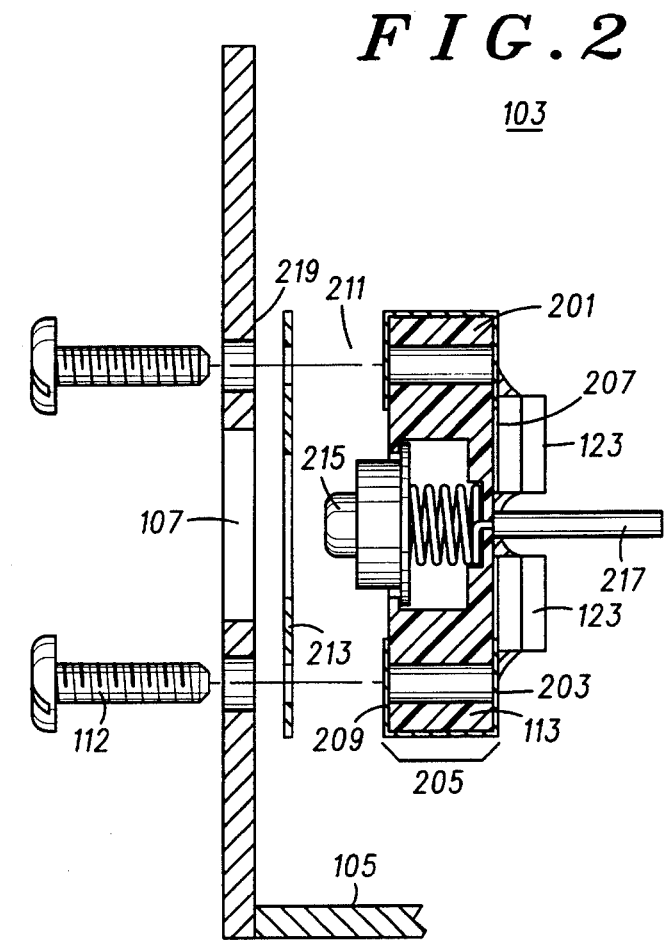
FIG. 2 is a detailed cross sectional diagram of a preferred embodiment in accordance with the instant invention.

Referring to FIG. 2 where like elements from FIG. 1 bear like reference numerals, a more detailed description, including some repetition, of the contact assembly (103) or battery contact having a high frequency energy filtering characteristic will be undertaken. The battery contact or contact assembly (103) includes a spring loaded battery contact (211) having a fixed portion (217) electrically coupled to a movable portion (215). The spring loaded battery contact (211) is arranged to conduct power from a power source in contact with the movable portion (215), such as a battery, to a load or circuit in contact with the fixed portion (217). Such spring loaded battery contacts are commercially available from various manufacturers such as Bi-Link Metal Specialties. Due to varying dimensional requirements these may be custom pans such as Motorola part number 3904248H01.

In addition the assembly includes a carrier (113) that has a dielectric portion (201) and a conductive portion (203). The dielectric portion (201) is mechanically coupled or affixed to the fixed portion (217) of the spring loaded battery contact (211) using a press fit or soldering technique. The carrier may, preferably, be a printed circuit board substrate, such as glass epoxy, where the bare substrate is the dielectric portion (201) and the conductive portion (203) is a printed circuit board conductor formed from a copper based material. The carrier (113) is generally a rectangular shaped construction having a length (301), width (303) (shown in FIG. 3) and thickness (205) with an inner surface (207) and an outer surface (209). The conductive portion (203), as depicted in FIG. 2, is arranged and disposed on both the inner surface (207) and the outer surface (209).

The assembly (103) further includes a chip capacitor(123) that is electrically coupled between the fixed portion (217) and the conductive portion (203) by, for example, a reflow soldering process. The chip capacitor (123) is mechanically coupled to the carrier (113), preferably by either solder from the reflow process or a small amount of glue between the chip capacitor and the inner surface (207). The values of the chap capacitor may be optimized for the frequency of the radiated energy as above. In any event the chip capacitor (123) thus provides a low impedance path from the fixed portion (217) to the conductive portion (203) for high frequency energy otherwise on the spring loaded battery contact (211).

In use in, for example, the FIG. 1 assembly a gasket (213) may be disposed around the port (107) between an interior surface (219) and the outer surface (209). The gasket is constructed from a conductive material such as copper and assures a good electrical coupling between the electrically conductive housing (105) and the contact assembly (103). This may provide an improved electromagnetic shielding effect for the assembly over a greater range of environmental variation in, for example, temperature, humidity, etc.

Figure 3:
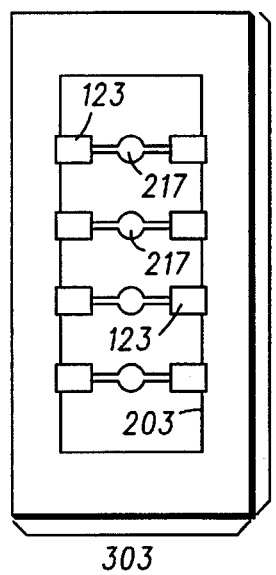
FIG. 3 is an inner side view of the FIG. 2 embodiment.

FIG. 3 depicts a view of the inner surface (207) of the carrier (113) used in the contact assembly (103) of FIG. 2. This is a representative configuration useful to provide a coupling mechanism for up to four distinct signals. The chip capacitors (123) are shown electrically coupled to the conductive portion (203) and the fixed portion (217), specifically a conductive trace that is coupled to the fixed portion (217).

It will be appreciated by those of ordinary skill in the art that the apparatus disclosed provides a battery contact or other signal contact with a high frequency filtering characteristic while avoiding the economic disadvantages of coaxial capacitors. This inventive apparatus may be readily and advantageously employed in a wireless packet data modem or other communications device or system to provide an electromagnetic barrier between the wireless data packet modem and a physically proximate computing device. Hence, the present invention, in furtherance of satisfying a growing problem for wireless data communications, readily facilitates portable data modems in combination with portable computing devices.

It will be apparent to those skilled in the art that the disclosed invention may be modified in numerous ways and may assume many embodiments other than the preferred form specifically set out and described above. Accordingly, it is intended by the appended claims to cover all modifications of the invention which fall within the true spirit and scope of the invention.

What is claimed is:

1. A shielded enclosure having a battery contact with a high frequency energy filtering characteristic for supplying power to the enclosure, comprising in combination:

an electrically conductive housing having a port through which power is provided to an interior of the enclosure;

a carrier, mechanically coupled to said housing, having a dielectric portion and a conductive portion, said dielectric portion coveting said port and said conductive portion electrically coupled to said housing and coveting a portion of said dielectric portion;

a battery contact, mechanically coupled to said dielectric portion, having a first part external to the enclosure and a second part within said interior; and a bypass capacitor within said interior mechanically coupled to said carrier and having a first contact and a second contact, said first contact electrically connected to said battery contact and said second contact electrically connected to said conductive portion, said bypass capacitor thereby providing a low impedance path from said battery contact to said housing for high frequency energy on said battery contact.

2. The shielded enclosure of claim 1, wherein the electrically conductive housing is arranged and constructed to surround a transceiver.

* * * * *